United States Patent
Oowaki

(10) Patent No.: US 6,404,696 B1
(45) Date of Patent: *Jun. 11, 2002

(54) RANDOM ACCESS MEMORY WITH DIVIDED MEMORY BANKS AND DATA READ/WRITE ARCHITECTURE THEREFOR

(75) Inventor: Yukihito Oowaki, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/943,504

(22) Filed: Aug. 31, 2001

Related U.S. Application Data

(63) Continuation of application No. 09/603,895, filed on Jun. 26, 2000, now Pat. No. 6,301,185, which is a continuation of application No. 08/578,900, filed on Dec. 27, 1995, now Pat. No. 6,118,721, and a continuation of application No. 08/330,120, filed on Oct. 27, 1994, now Pat. No. 5,477,351, which is a continuation of application No. 08/120,221, filed on Sep. 14, 1993, now abandoned, which is a continuation of application No. 07/956,469, filed on Oct. 2, 1992, now abandoned, which is a continuation of application No. 07/704,733, filed on May 20, 1991, now abandoned, which is a continuation of application No. 07/338,157, filed on Apr. 14, 1989, now abandoned.

(30) Foreign Application Priority Data

Apr. 18, 1988 (JP) .............................. 63-93511

(51) Int. Cl.$^7$ ................................ G11C 8/00
(52) U.S. Cl. ............................. 365/230.03; 365/230.08
(58) Field of Search ......................... 365/230.03, 230.08

(56) References Cited

U.S. PATENT DOCUMENTS

| | | | |
|---|---|---|---|
| 4,130,900 A | 12/1978 | Watanabe | 365/230.03 |
| 4,498,155 A | 2/1985 | Mohan Rao | 365/221 |
| 4,630,230 A | 12/1986 | Sundet | 365/189.05 |
| 4,646,270 A | 2/1987 | Voss | 365/230.03 |
| 4,663,742 A | 5/1987 | Andersen et al. | 365/230.03 |
| 4,683,555 A | 7/1987 | Pinkham | 365/230.03 |
| 4,725,945 A | 2/1988 | Kronstadt et al. | 365/230.03 |
| 5,497,351 A | * 3/1996 | Oowaki | 365/230.03 |
| 6,118,721 A | * 9/2000 | Oowaki | 365/230.03 |
| 6,301,185 B1 | * 10/2001 | Oowaki | 365/230.03 |

FOREIGN PATENT DOCUMENTS

| | | | | |
|---|---|---|---|---|
| JP | 60-157798 | 8/1985 | | |
| JP | 0008785 | * 1/1986 | ............ | G11C/7/00 |
| JP | 61-114351 | 6/1986 | | |
| JP | 63-63199 | 3/1988 | | |

OTHER PUBLICATIONS

Betty Prince, "Semiconductor Memories", 1983, Wiley, 2$^{nd}$ p. 151.*

* cited by examiner

Primary Examiner—Trong Phan
Assistant Examiner—M. Tran
(74) Attorney, Agent, or Firm—Oblon, Spivak, McClelland, Maier & Neustadt, P.C.

(57) ABSTRACT

A dynamic random access memory with two divided memory banks is disclosed wherein memory cells are divided into first and second groups each of which includes an array of memory cells connected to a corresponding word line. Those memory cells are subdivided into subgroups each of which has four memory cells. A first set of input/output lines is provided for the first group of memory cells, and a second set of input/output lines is provided for the second group of memory cells. An output circuit section is connected to the those sets of input/output lines to output data transferred thereto. An access controller section specifies subgroups alternately from the first and second groups of memory cells with four memory cells as a substantial access minimum unit, accesses memory cells of a specified subgroup to read stored data therefrom and transfers the read data to corresponding input/output lines associated therewith. The read data is supplied to the output circuit section for conversion to serial data and then output therefrom.

48 Claims, 9 Drawing Sheets

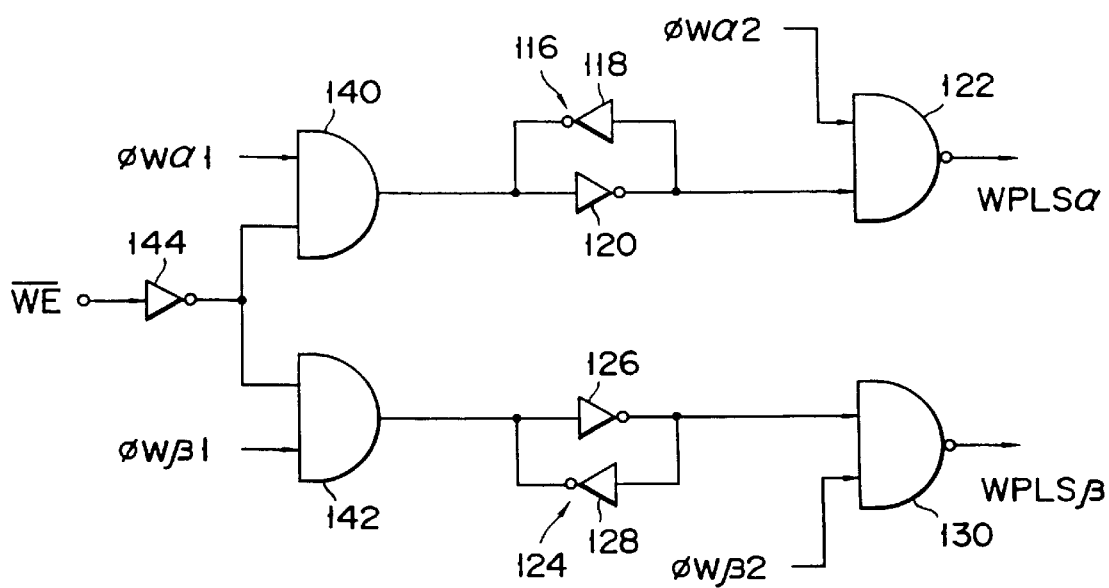
F I G. 9

RANDOM ACCESS MEMORY WITH DIVIDED MEMORY BANKS AND DATA READ/WRITE ARCHITECTURE THEREFOR

The present application is a continuation of U.S. application Ser. No. 09/603,895 filed Jun. 26, 2000 now U.S. Pat. 6,301,185, which in turn is a continuation of U.S. application Ser. No. 08/578,900 filed Dec. 27, 1995 now U.S. Pat. 6,118,721, and is a continuation of U.S. application Ser. No. 08/330,120 filed Oct. 27, 1994, now U.S. Pat. No. 5,497,351, which is a continuation of U.S. application Ser. No. 08/120,221 filed Sep. 14, 1993 now abandoned, which is a continuation of U.S. application Ser. No. 07/956,469, filed Oct. 2, 1992 now abandoned, which is a continuation of U.S. application Ser. No. 07/704,733, filed May 20, 1991 now abandoned, which is a continuation of U.S. application Ser. No. 07/338,157, filed Apr. 14, 1989 now abandoned, the entire contents of each of which of the above-identified applications are hereby incorporated herein by reference.

BACKGROUND OF THE INVENTION

1. Field of the Invention

The present invention relates to semiconductor memory devices and, more particularly, to a serial read/write architecture for dynamic random access memories.

2. Description of the Related Art

With increasing needs for high-speed logic performance of digital systems, high-speed access techniques, which permit high-speed access to data stored in semiconductor memories such as random access memories, are becoming increasingly important. The performance of central processing units, or CPUs is progressing rapidly. Naturally memory accessing requires speeding up accordingly.

To speed up the transfer of necessary data to a CPU, a cache memory is often used as an auxiliary memory of a system main memory formed of a DRAM. In this case, a gate is connected between the CPU and the main memory, and the cache memory is directly connected to the CPU via a data bus and an address bus. A controller is connected to the gate and cache memory so as to control data transfer among the main memory, cache memory and CPU. In this case also, nay, even more particularly in this case, speeding up of data access in the DRAM serving as main memory is very important. This is because, when data that the CPU needs is not accidentally stored in the cache memory (that is, when the data is "mishit"), the gate opens under the control of the controller to fetch necessary data from the main memory. To this end, high-speed accessing of the main memory is essential.

As the presently available data accessing techniques for DRAMs, there are known architectures of the nibble mode, the page mode, the static column mode and so on. However, those architectures cannot successfully meet the above technical requirements. DRAMs themselves are on the path to high-density integration, and the above current data accessing techniques are gradually losing their utility in the midst of rapid increase in integration density of the DRAMs.

More specifically, according to the nibble mode architecture by way of example, data stored in a DRAM are serially accessed with 4 bits or 8 bits as a unit. Column data in a selected row address are accessed in an established order in unit of a predetermined number of bits, thus permitting high-speed read/write. However, idleness will inevitably occurs with data transfer between the cache memory and the DRAM because the unit bit number and the accessing order of data units is fixed in a selected row address. In contrast to the nibble mode architecture, according to the page mode or static column mode architecture, although a desired bit can be accessed randomly in a selected row address, an idle time for restoring will inevitably occur in accessing consecutive random bits, which impairs speeding up of data accessing.

SUMMARY OF THE INVENTION

It is therefore an object of the present invention to provide a new and improved data accessing architecture which is successfully implemented in semiconductor memories and improves their data accessing efficiency.

In accordance with the above object, the present invention is addressed to a specific semiconductor memory device with divided memory banks, wherein memory cells are divided into first and second groups. The first group of memory cells constitutes a first memory bank, and the second group of memory cells constitutes a second memory bank. Each of the first and second memory groups includes an array of memory cells which are subdivided into subgroups each of which has a selected number of memory cells. A first set of input/output lines is provided for the first group of memory cells, whereas a second set of input/output lines is provided for the second group of memory cells. An output circuit section is connected to the first and second input/output lines to output data transferred thereto. An access controller section specifies the subgroups alternately from the first and second groups with the selected number of memory cells as a substantial minimum accessing unit, accesses the memory cells in a specified subgroup to read stored data therefrom and transfers the read data to a corresponding one of the first and second sets of input/output lines. The read data is supplied to the output circuit section.

The invention and its object and advantages will become more apparent from the detailed description of a preferred embodiment presented below.

BRIEF DESCRIPTION OF THE DRAWINGS

In the detailed description of a preferred embodiment of the present invention presented below, reference is made to the accompanying drawings of which:

FIG. 9 illustrates a modification of the internal circuit arrangement of the write controller of FIG. 6.

DETAILED DESCRIPTION OF THE PREFERRED EMBODIMENT

Figure 1:
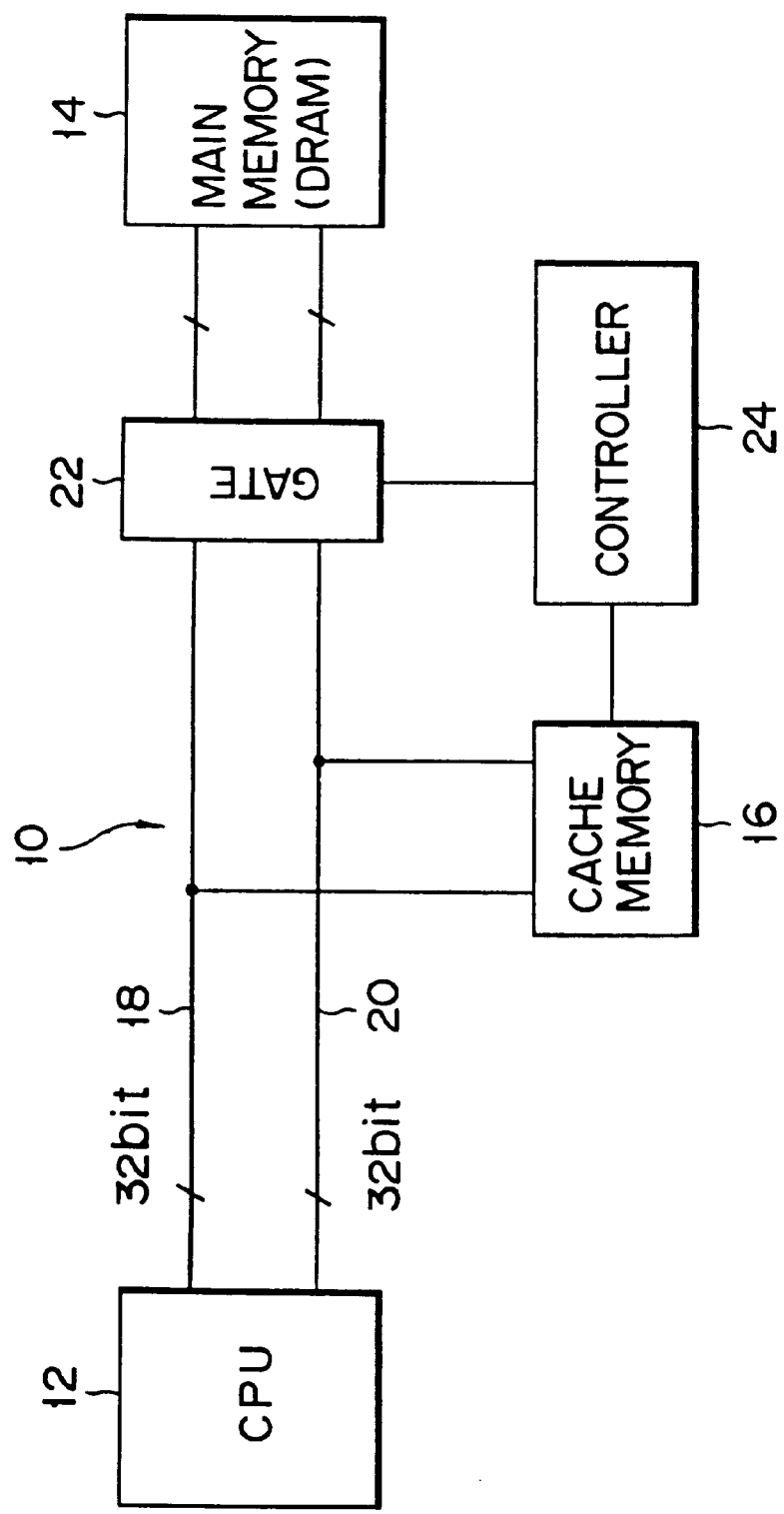
FIG. 1 is a simplified block diagram of the overall arrangement of a computer system including a high-speed cache memory and a main memory using a dynamic random access memory according to a preferred embodiment of the present invention.

Referring now to FIG. 1, a computer system equipped with a dynamic random access memory (abbreviated to DRAM hereinafter) in accordance with a preferred embodiment of the present invention is generally indicated at 10. A central processing unit (CPU) 12 is associated with a DRAM 14 acting as a main memory and a cache memory 16 via a 32-bit data bus 18 and a 32-bit address bus 20. A gate circuit 22 is connected between CPU 12 and main memory 14. A controller 24 is connected to cache memory 16 and gate circuit 22 so as to control the switching operation of gate-circuit 22 and data transfer between main memory 14 and cache memory 16.

When needing data, CPU 12 accesses a certain memory location in cache memory 16. If desired data exists in the accessed memory location (if data is "hit"), the data is transferred to CPU 12 via data bus 18. In case where desired data is not in the accessed location (if data is "mishit"), a mishit signal is applied to controller 24. In response to the mishit signal, controller 24 opens gate 22 so that CPU 12 can access main memory 14 to read data therefrom. The read data is transferred to cache memory 16 as well as CPU 12 via data bus 18 to be stored therein.

Figure 2A:
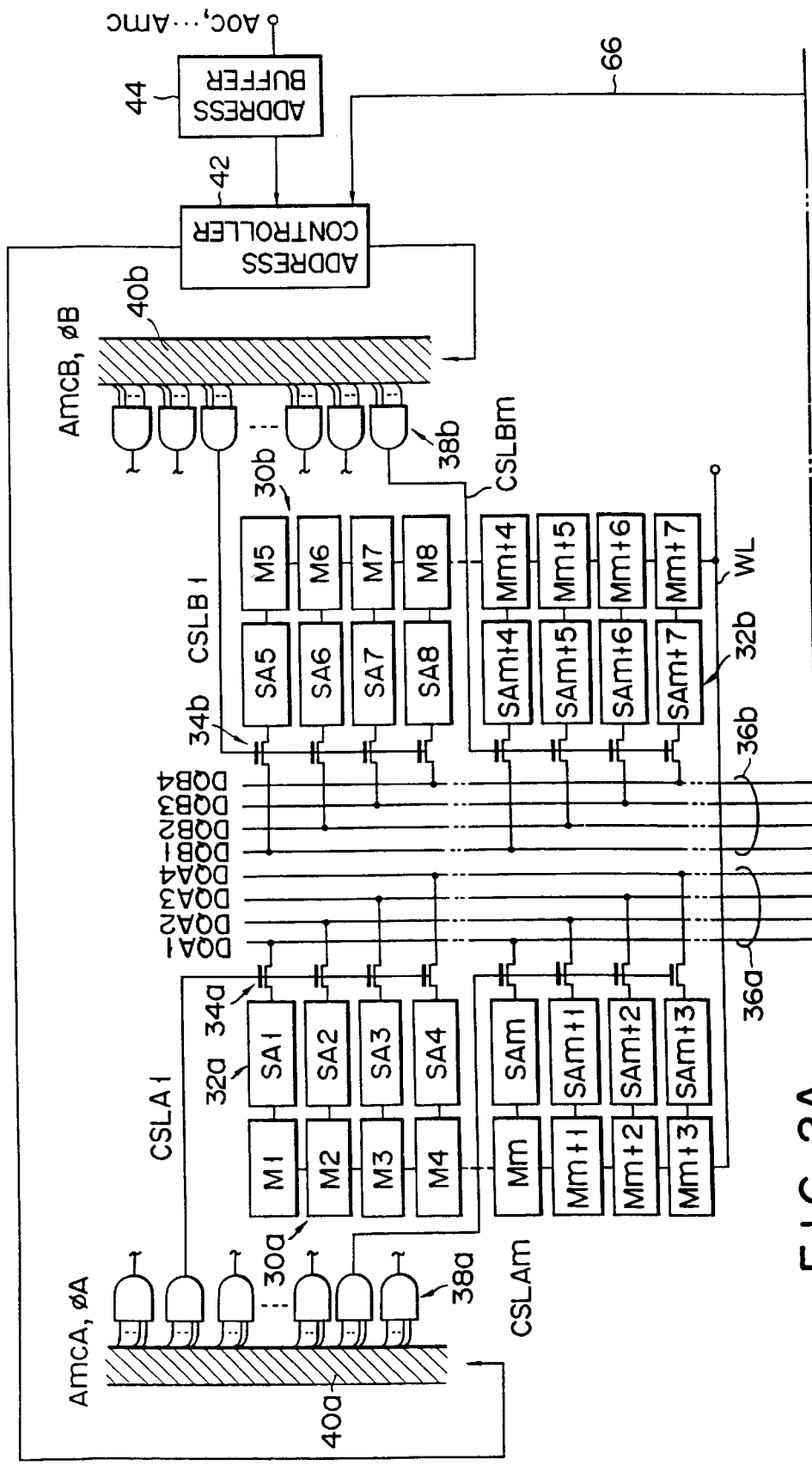
FIGS. 2A and 2B illustrate in block form main portions of an internal circuit arrangement of the dynamic random access memory of the invention.
Figure 2B:
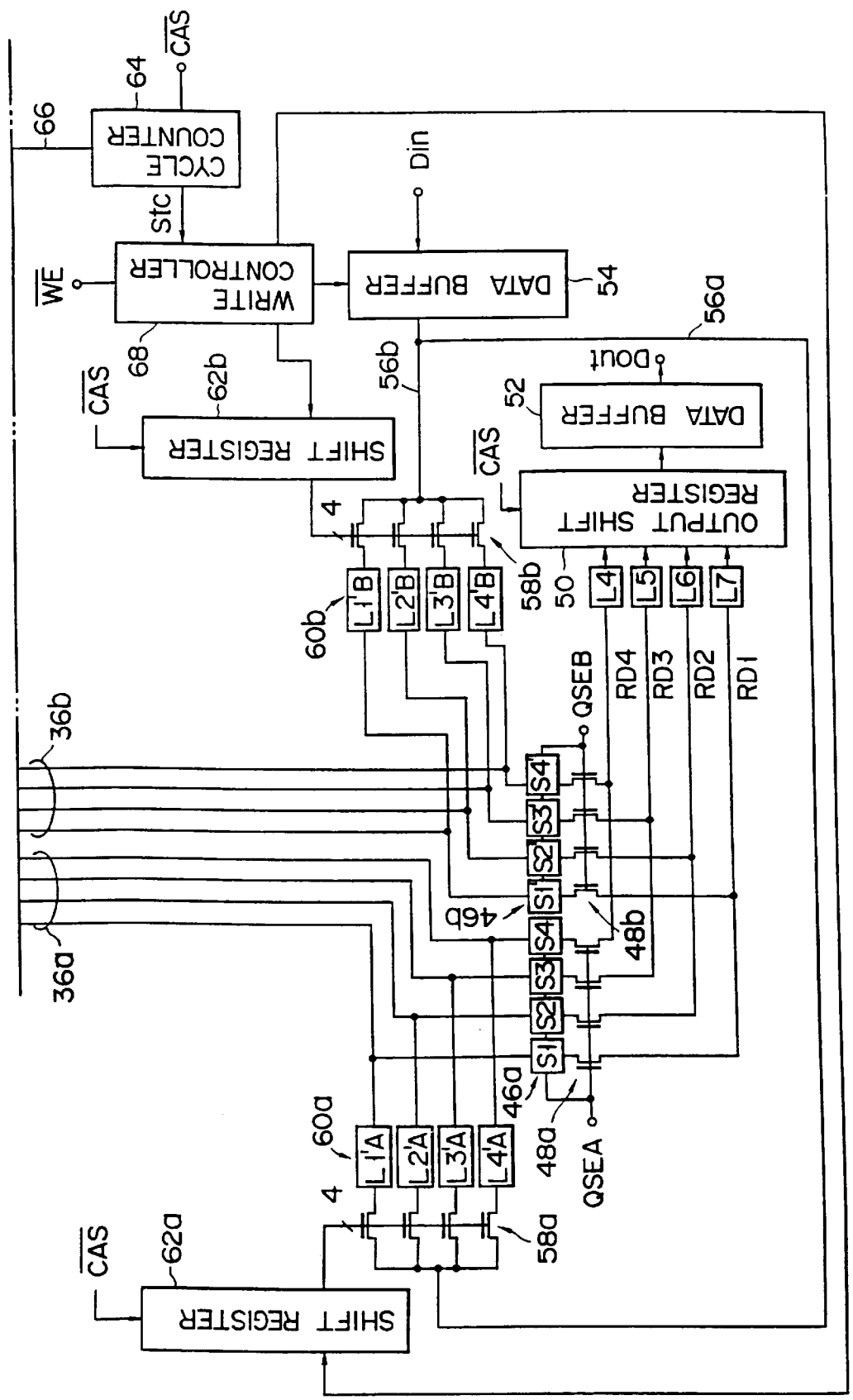

FIG. 2 illustrates main portions of an internal circuit arrangement of DRAM 14 serving as the main memory of FIG. 1. Note that, since the overall circuit configuration is too large to be illustrated upon a sheet, the drawing thereof is divided into two figures, i.e., FIG. 2A and FIG. 2B. As shown in FIG. 2A, memory cells 30 coupled to a word line WL are divided into two systemic groups 30a and 30b. The first group is A systemic memory bank 30a, which comprises memory cells M1, M2, M3, M4, . . . , Mm, Mm+1, Mm+2, Mm+3. The second group is B systemic memory bank 30b, which comprises memory cells M5, M6, M7, M8, . . . , Mm+4, Mm+5, Mm+6, Mm+7, . . . In each memory bank, four memory cells forms one unit. In other words, each memory bank is subdivided into a selected number of subunits each of which has four memory cells (i.e. four bits) in this example. All the memory cells can be driven by one word line WL. To state it differently, word line WL is common to all the memory cells 30 of the A and B memory banks. Note that although, in FIG. 2A, only one word line is illustrated for simplification of the drawing, other word lines also have the same memory cell arrangements associated therewith.

Memory banks 30a and 30b have sense amplifier arrays 32a and 32b, respectively. Sense amplifier arrays 32 have sense amplifiers SA1, SA2, . . . which are respectively connected to memory cells 30. Sense amplifiers SA are connected to FET transfer gate arrays 34a and 34b acting as transfer gates. Transfer gate array 34a is connected to an A systemic data input/output line set 36a. Line set 36a comprises four pairs of input/output lines DQA1, DQA2, DQA3 and DQA4. (In the drawing each pair of input/output lines is depicted as if it were one line for convenience of explanation.) On the other hand, transfer gate array 34b is connected to a B systemic data input/output line set 36b. Line set 36b comprises four pairs of input/output lines DQB1, DQB2, DQB3 and DQB4. Column address decoder units 38a and 38b are associated with memory banks 30a and 30b, respectively. Each of column address decoder units 38 has an array of column address decoders. In FIG. 2A, each of portions 40a and 40b to which hatching is made for convenience sake represents a collection of numerous signal lines to be connected to inputs of decoders 38.

For example, referring to memory cells M1, M2, M3 and M4 of the first subgroup of memory bank 30a, sense amplifiers SA1, SA2, SA3 and SA4 are connected to input/output lines DQA1, DQA2, DQA3 and DQA4, respectively, through corresponding transfer gate FETs 34a. Those four transfer gate FETs 34a have their gate electrodes connected together. Those transfer gate FETs 34a are responsive to a column select signal to be rendered conductive or nonconductive. The column select signal is supplied from one decoder of corresponding address decoder unit 38a to FETs 34a through one line CSLA1 of A systemic select lines CSLA.

Referring to memory cells M5, M6, M7 and M8 of the first subgroup of memory bank 30b, on the other hand, sense amplifiers SA5, SA6, SA7 and SA8 are connected to input/output lines DQB1, DQB2, DQB3 and DQB4, respectively, through corresponding transfer gate FETs 34b. Those four transfer gate FETs 34b have their gate electrodes connected together. Those transfer gate FETs 34b are responsive to a column select signal to be rendered conductive or nonconductive. The column select signal is supplied from one decoder of corresponding address decoder unit 38b to FETs 34b through one line CSLB1 of B systemic select lines CSLB.

As shown in FIG. 2A, an address controller 42 is connected to the two groups of column address decoder units 38a and 38b. When receiving a column address Amc (o<m<n; n=an integer) via an address buffer 44, address controller 42 controls address decoders 38 so as to designate a proper memory cell subunit from memory banks 30a and 30b in accordance with the received column address.

As shown in FIG. 2B, A systemic input/output lines DQA1, DQA2, DQA3 and DQA4 are connected to data amplifiers S1, S2, S3 and S4, respectively, of an amplifier section 46a. Data amplifiers S1, S2, S3 and S4 are connected to data readout lines RD1, RD2, RD3 and RD4, respectively, through corresponding FETs 48a serving as data readout transfer gates. Data amplifiers S1, S2, S3 and S4 are simultaneously activated by an externally applied control signal QSEA, and gate FETs 48a are simultaneously rendered conductive by control signal QSEA. Data readout lines RD1, RD2, RD3 and RD4 are connected to data latch circuits L1, L2, L3 and L4, respectively. Data latch circuits L1, L2, L3 and L4 are connected to a data output shift register 50 to which a column address strobe signal $\overline{CAS}$ is applied. Shift register 50 is connected to an output terminal Dout via an output buffer 52.

B systemic input/output lines DQB1, DQB2, DQB3 and DQB4 are connected to data amplifiers S1', S2', S3' and S4', respectively, of an amplifier section 46b. Data amplifiers S1', S2', S3' and S4' are connected to data readout lines RD1, RD2, RD3 and RD4, respectively, through corresponding FETs 48b serving as data readout transfer gates. Data amplifiers S1', S2', S3' and S4' are simultaneously activated by an externally applied control signal QSEB, and gate FETs 48b are simultaneously rendered conductive by control signal QSEB. Four-bit parallel data read out of data readout gate section 46a or 46b are held by latch circuits L1 to L4 and then converted to serial data by shift register 50. The converted readout data is taken from output terminal Dout via output buffer 52.

For example, four-bit input data is entered from an input terminal Din and then applied to an input data buffer 54.

Data buffer 54 is connected via write circuit section 58a to input/output line group 36a of A memory bank 30a, i.e., input data latch circuit section 60a associated with lines DQA1, DQA2, DQA3 and DQA4. Gate section 58a has four FETs which are connected via corresponding latch circuits L1'A, L2'A, L3'A and L4'A of latch circuit section 60a to input/output lines DQA1, DQA2, DQA3 and DQA4, respectively. The FETs of gate circuit section 58a are controlled by an input data shift register 62a responsive to a column address strobe signal $\overline{CAS}$. On the other hand, data buffer 54 is connected via write circuit section 58b to input/output line group 36b of B memory bank 30b, i.e., input data latch circuit section 60b associated with lines DQB1, DQB2, DQB3 and DQB4. Gate section 58b has four FETs which are connected via corresponding latch circuits L1'B, L2'B, L3'B and L4'B of B-series latch circuit section 60b to input/output lines DQB1, DQB2, DQB3 and DQB4, respectively. The FETs of gate circuit section 58b are controlled by an input data shift register 62B operated by column address strobe signal CAS.

Column address strobe signal $\overline{CAS}$ (referred to as $\overline{CAS}$ signal hereinafter) is entered to a CAS cycle counter 64 first. Cycle counter 64 supplies the $\overline{CAS}$ signal to an address controller 42 (see FIG. 2A) via a line 66. The $\overline{CAS}$ signal alternates (toggles) between a high ("H") level and a low ("L") level. Column addresses Amc, i.e., A0c to Anc are latched by address buffer 44 in synchronization to a transition of the $\overline{CAS}$ signal from "H" level to "L" level. Address buffer 44 converts entered column addresses A0c to Amc from TTL logic signal levels to MOS logic signal levels. Address controller 42 generates A systemic column addresses A0cA to AmcA and B systemic column addresses A0cB to AncB. The column addresses A0cA to AncA are applied to column address decoder units 38a, whereas the column addresses A0cB to AncB are applied to column address decoder units 38b shown in FIG. 2A. $\overline{CAS}$ cycle counter 64 (see FIG. 2B) counts the number of level changes of the $\overline{CAS}$ signal to produce a count signal Stc. The count signal Stc is applied to a data write controller 68, which is connected to input data buffer 54 and input data shift registers 62a and 62b. Data write controller 68 is responsive to an externally applied write enable signal (referred to as $\overline{WE}$ signal hereinafter) to control the operation of those circuits 54, 62a and 62b.

Figure 3:
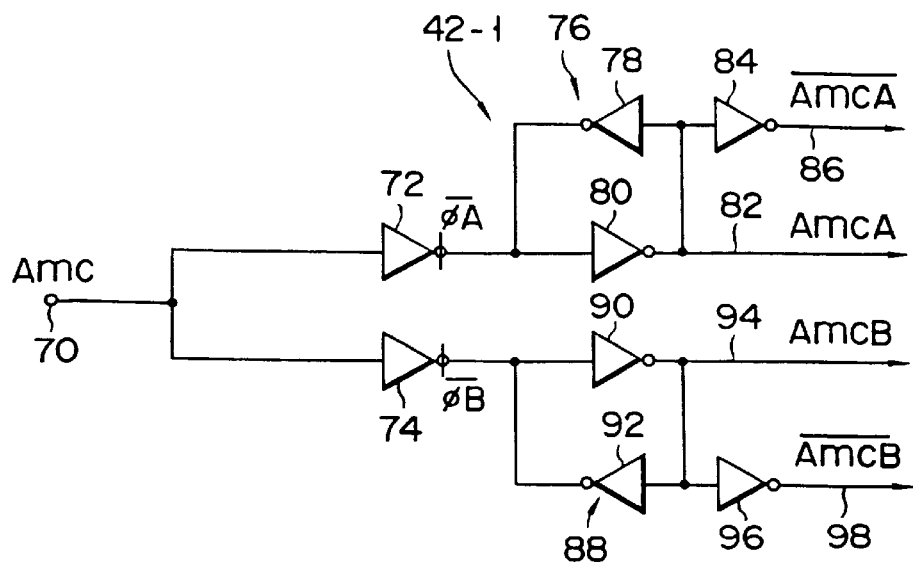
FIG. 3 is a diagram partially showing an internal circuit arrangement, which corresponds to 1 bit address, of the address controller of FIG. 2.

A circuit arrangement of address controller 42 for addressing memory banks 30a and 30b will now detailed with reference to FIG. 3. Address controller 42 has address control circuits corresponding in number to the memory subunits of each of memory banks 30a and 30b. In FIG. 3, only one address control circuit, for example, address control circuit 42-1 is shown.

Address control circuit 42 receives column addresses Amc (A0c to Amc) at its input terminal 70 which is connected to inputs of clocked inverters 72 and 74 of address control circuit 42-1. Inverter 72 has an input connected to a latch circuit 76 having cross-coupled inverters 78 and 80. Inverter 80 provides address AmcA for A memory bank 30a onto a line 82. Inverter 78 is connected back to back with another inverter 84 which provides another address $\overline{AmcA}$ for A memory bank 30a to line 86. The arrangement for address control circuit 42 is the same as that for the A system described above. Though the explanation may be redundant, inverter 74 has an input connected to a latch circuit 88 having cross-coupled inverters 90 and 92. Inverter 90 provides address AmcB for B memory bank 30b to a line 94. Inverter 96 is connected to another inverter 96 which provides another address $\overline{AmcB}$ for B memory bank 30b to line 98. Addresses AmcA, $\overline{AmcA}$, AmcB and $\overline{AmcB}$ are transferred to column address decoder units 38a and 38b shown in FIG. 2A.

Figure 4:
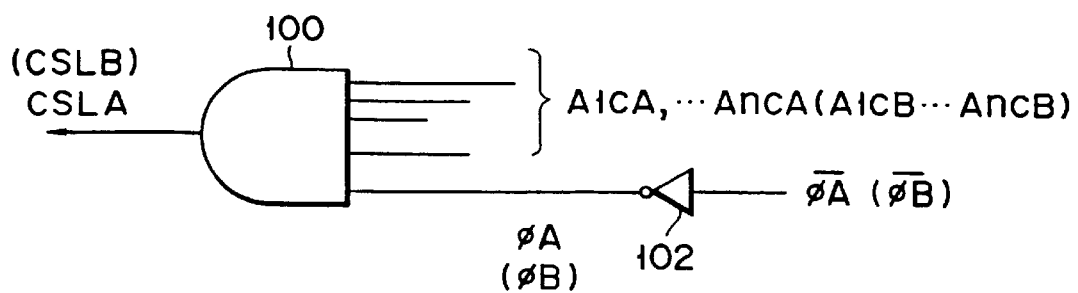
FIG. 4 is a diagram illustrating an internal circuit arrangement of one of the column address decoder units of FIG. 2.

In FIG. 4, there is illustrated a given one of column address decoder units 38a and 38b, which is a multi-input AND gate 100 having an input which receives an inverted version $\phi A$ (or $\phi B$) of an internal clock signal $\overline{\phi A}$ (or $\overline{\phi B}$) from an inverter 102 and other inputs supplied with addresses AmcA (or AmcB). Where AND gate 100 is a decoder for A memory bank 30a, the internal clock signal applied to AND gate 100 is clock signal $\overline{\phi A}$ and the address signals are signals A1cA, A2cA, . . . , AncA. In this case, AND gate 100 sequentially outputs column address strobe signals CAS1, CAS2, . . . , CASm.

Next, operation modes of the DRAM constructed as above will be described with reference to the accompanying waveform diagrams. In the following description, a data read mode, a data write mode and an operation mode alternating between data read and data write will be described in order of mention.

DATA READ MODE

Figure 5:
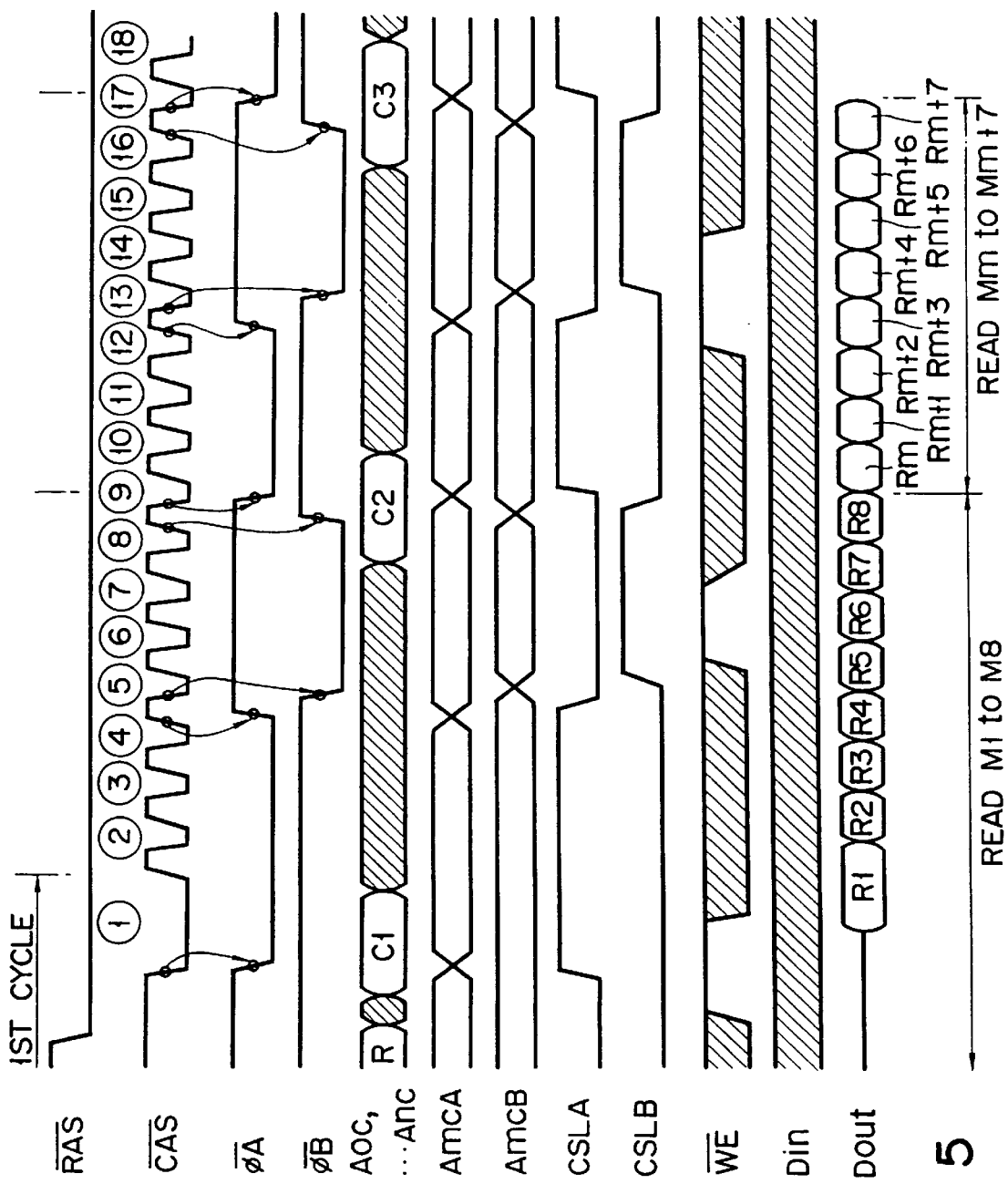
FIG. 5 illustrates waveforms of electrical signals developed at various locations of the DRAM in a data read mode.

As shown in FIG. 5 (in which signal portions to which hatching is made represent "Don't Care"), when row address strobe signal $\overline{RAS}$ goes to a "L" level and subsequently column address strobe signal $\overline{CAS}$ goes to a "L" level, internal clock signal $\overline{\phi A}$ is switched from a "H" level to a "L" level in synchronization with the transitions of the strobe signals in level. At this point, internal clock signal $\overline{\phi B}$ is held at a "H" level. In address controller 42 (see FIG. 3), when clock signal $\overline{\phi A}$ goes to "L" level during the on-state of inverters 72 and 74, inverter 72 for A memory bank 30a is rendered off. Column addresses Amc from column address buffer 44 (see FIG. 2A) are held in latch circuit 76. Therefore, A column addresses AmcA and $\overline{AmcA}$ continue to be produced on lines 82 and 84. In this situation, the other latch circuit 88 is off and hence its output is indefinite.

Column address decoder units 38a and 38b associated with memory banks 30a and 30b receive output signals from address controller 42, and column address decoder unit 38a selectively specifies one (e.g. line CSLA1) of column address select lines CSLA during the time that clock signal $\overline{\phi A}$ is at "L" level. Where $\overline{RAS}$ signal is at "L" level so that the DRAM chip is activated, and word line WL is at "H" level so that all the bit line sense amplifiers SA1 to SAm+7 are activated, when one column address line CSLA1 is selected, a set of transfer gates 34a connected to one subgroup of memory cells M1, M2, M3 and M4 of A memory bank 30a are simultaneously turned on. Hence, four-bit data stored in memory cells M1, M2, M3 and M4 of A memory bank 30a are transferred in parallel to input/output lines DQA1, DQA2, DQA3 and DQA4 via those transfer gates.

After the data transfer, control signal QSEA (see FIG. 2B) goes to "H" level. In response to this control signal data amplifiers S1, S2, S3 and S4 are activated and at the same time readout gates 48a are turned on. Therefore, the read four-bit data are transferred to output lines RD1, RD2, RD3 and RD4 and subsequently held by output data latch circuits L1, L2, L3 and L4. The parallel data held in the latch circuits is next converted to serial data by output shift register 50. The serial data is output from output data buffer 52 as data R1 to R4 in synchronization with first four toggling steps of $\overline{CAS}$ signal (in FIG. 5, the toggling step Nos. of $\overline{CAS}$ signal are shown enclosed by circles for convenience of explanation). After the transferred data to input/output lines DQA1, DQA2, DQA3 and DQA4, namely, the read data are held by data latch circuits L1, L2, L3 and L4, such reset operations as precharge input/output lines DQA1, DQA2, DQA3 and DQA4 are initiated.

After the termination of the above series of operations, internal clock signals φA, φB are switched: clock signal $\overline{\phi A}$ goes to "H" level, and clock signal $\overline{\phi B}$ goes to "L" level. As a result, not A memory bank 30a but B memory bank 30b are enabled this time. More specifically, a certain group of memory cells M5, M6, M7 and M8 of B memory bank 30b have been sensed by corresponding bit-line sense amplifiers SA5, SA6, SA7 and SA8 and thus placed in the readable state during the time that data are read from the group of memory cells M1, M2, M3 and M4 of A memory bank 30a. The four-bit data of memory cells M1, M2, M3 and M4 appear on input/output lines DQB1, DQB2, DQB3 and DQB4 in response to level transitions of clock signals $\overline{\phi A}$ and $\overline{\phi B}$. This is because column select signal CSLB1 produced by column address decoder unit 38b associated with B-series memory bank 30b goes to "H" level, and of gates 34b, the gates which are associated with memory cells M5, M6, M7 and M8 are turned on.

In response to control signal QSEB going to "H" level, data amplifiers S1', S2', S3' and S4' are activated and readout gates 48b are turned on. The read four-bit data, therefore, are read out onto output lines RD1, RD2, RD3 and RD4 and afterward transferred via output lines RD1, RD2, RD3 and RD4 to output latch circuits L1, L2, L3 and L4 to be held therein in essentially the same manner as in the case of the data stored in memory cells M1, M2, M3 and M4 of A memory bank 30a. The parallel data held in the latch circuits is next converted to serial data, which is output from output data buffer 52 as data R5 to R8 in synchronization with four successive toggling steps of $\overline{CAS}$ clock signal.

Since clocked inverter 74 is turned off in address controller 42 while B memory bank 30b is selected, the addresses which have continued to be produced by column address buffer 64 are held by latch circuit 88, thereby providing addresses AmcB and $\overline{AmcB}$ for B memory bank 30b. Those addresses AmcB and $\overline{AmcB}$ are essentially the same as the above mentioned addresses AmcA and $\overline{AmcA}$ for A memory bank 30a. As shown in FIG. 4, column address decoder 38b ANDs signals A1cB, A2cB, A3cB, ..., AncB and clock signal $\overline{\phi B}$ to provide only one column address select signal CSLB1.

During the alternate read cycles of cell units each of four memory cells of A memory bank 30a and B memory bank 30b, for example, during the read cycles of memory cells M1 to M8, a first column address for a memory cell to be read next is entered, and column addresses A0c to Anc are entered to address buffer 44 in synchronization with the sixth toggling step from the first toggling step of $\overline{CAS}$ signal. Since clock signal $\overline{\phi A}$ is at "H" level at this point, latch circuit 76 of address controller 42 will be supplied with a new column address Amc. The signal A0c is rendered "Don't Care" from this second entry of the address. Alternatively the signal A0c may be rendered "Don't Care" from the first entry of the address.

By repeating the above reading operation, data can be read alternately from A memory bank 30a and B memory bank 30b in unit of four memory cells of a desired cell unit. Every data of eight consecutive bits contains desired four-bit data from A memory bank 30a and four-bit data from B memory bank 30b. Reading eight bits consecutively from one of the memory banks is not allowed. In each memory bank, however, units of four-bit memories need not be necessarily specified simply in their order. At the time of readout of succeeding data of eight bits, the first four bits can arbitrarily be read from one of memory banks 30a and 30b, and the remaining four bits can be read at random from the other of memory banks 30a and 30b. This is very simple because a starting address of each cell unit has only to be specified by use of signal AmcA or AmcB. Such a data reading concept could be named the "random serial read/write architecture" or "nibbled-page architecture."

For example, after the completion of sequential data readout from a specific subgroup of memory cells M1 to M4 in the A memory bank and a specific subgroup of memory cells M5 to M8 in the B memory bank, when data requires reading from a certain subgroup of memory cells Mm, Mm+1, Mm+2 and Mm+3 in A memory bank 30a, the data stored therein are transferred to input/output lines DQA1, DQA2, DQA3 and DQA4 and read from output buffer 52 in the same manner as above in synchronization with ninth to twelfth toggling steps of $\overline{CAS}$ signal. Subsequently, column select signal CSLBm goes to "H" level, and, as in the case of memory cells M5 to M8 described above, data are read from memory cells Mm+4, Mm+5, Mm+6 and Mm+7 in B memory bank 30b. Reading the four-bit data is performed in synchronization with the thirteenth to sixteenth toggling steps of $\overline{CAS}$ signal.

As described above, memory accessing for data readout is performed in unit of eight bit cells selected from two memory subgroups, each of four memory cells, included in A memory bank 30a and B memory banks 30b. In the midst of accessing the latter four bit cells, that is, at the time of the sixth toggling step of $\overline{CAS}$ signal, column addresses are ready for access to the next series of eight bit cells. Input/output lines DQA1, DQA2, DQA3 and DQA4 of A memory bank 30a are in non-selected state while B memory bank 30b is accessed so that precharging of input/output lines DQA1, DQA2, DQA3 and DQA4 has no influence on accessing of next selected memory cells of A memory bank 30a. Accordingly, reading from memory cells Mm to Mm+7 selected following memory cells M1 to M8 continues smoothly without intermission.

DATA WRITE MODE

Figure 6:
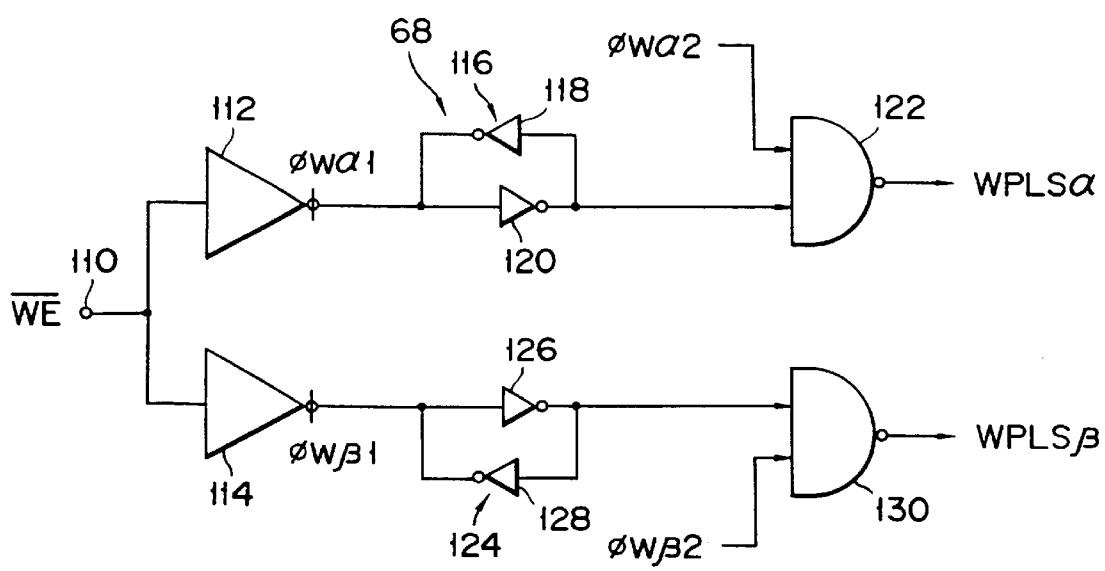
FIG. 6 is a diagram showing an internal circuit arrangement of the write controller of FIG. 2.

Prior to description of the writing operation, an internal circuit arrangement of write controller 54 shown in FIG. 2B will be described with reference to FIG. 6. (The reason why the description of the circuit arrangement was not presented before is that the arrangement of the write controller is closely related to the writing operation described below and the description here seems to raise the efficiency of description.) As shown in FIG. 6, write controller 69 receives a $\overline{WE}$ signal at its input terminal 110. $\overline{WE}$ signal is applied to a parallel array of a selected number of clocked inverters including clocked inverters 112 and 114. (In FIG. 6, there is illustrated only two typical clocked inverters for simplification of illustration.) Inverter 112 is connected to a latch circuit 116 comprised of cross-coupled inverters 118 and 120. The output of latch circuit 116 is connected to an input of a two-input NOR gate 122. NOR gate 122 has the other input supplied with an internal clock signal φWα2 used for writing into the A memory bank. NOR gate 122 provides an output signal WPLSα. On the other hand, the other clocked inverter 114 is connected to a latch circuit 124 comprised of cross-coupled inverters 126 and 128. The output of latch circuit 124 is connected to an input of a two-input NOR gate 130. NOR gate 130 has the other input supplied with an internal clock signal φWβ2 used for writing into the B memory bank. NOR gate 130 provides an output signal WPLSβ.

Figure 7:
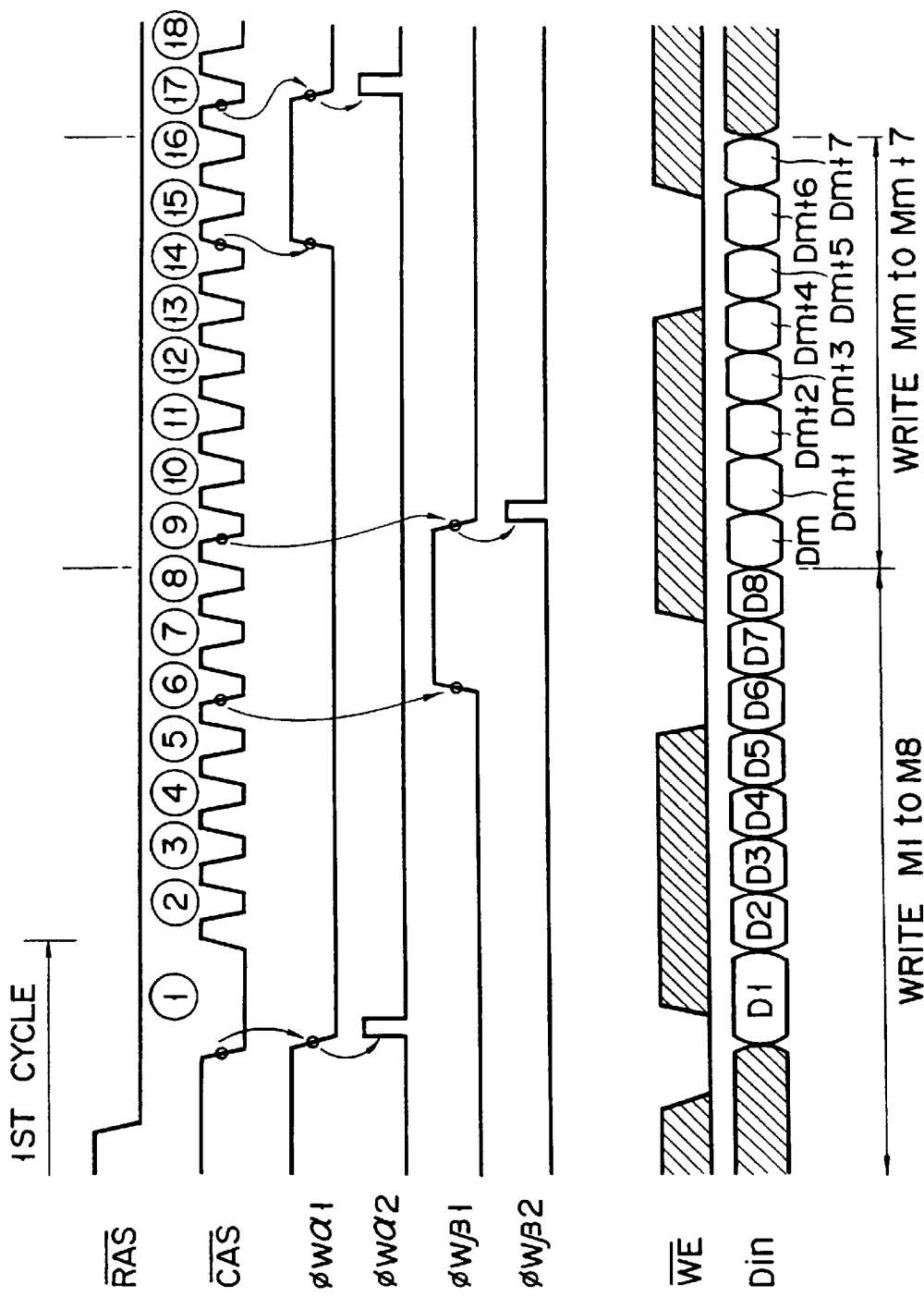
FIG. 7 illustrates waveforms of electrical signals developed at various locations of the DRAM in a data write mode.

Let us now consider the case where memory cells M1 to M8 and memory cells Mm to Mm+7 are subjected to data writing in the same order as that in the above described data reading. As shown in FIG. 7, $\overline{RAS}$ signal goes to "L" level and subsequently $\overline{CAS}$ signal goes to "L" level. In response to the first low-going level transition of $\overline{CAS}$ signal, internal clock signal $\overline{\phi A}$ goes from "H" level to "L" level, and clock signal $\overline{\phi B}$ is held at "H" level. Under this situation, one of column address decoders 38a for A memory bank 30a is selected in accordance with address data from address controller 42 to specify, for example, column select line CSLA1. If internal clock signals $\overline{\phi A}$ and $\overline{\phi B}$ are switched in level, then one of column address decoders 38b for B memory bank 30b is selected to specify, for example, column select signal CSLB1. As a result, eight bit memory cells of memory cells M1 to M4 and memory cells M5 to M8 are accessed, which is fundamentally the same as that in the read mode.

If $\overline{WE}$ signal is at "L" level at the time of the first low-going level transition of $\overline{CAS}$ signal, then write controller 68 becomes operative. In write controller 68, internal clock signal $\phi W\alpha 1$ goes to "L" level in response to the first low-going level transition of $\overline{CAS}$ signal, thereby producing pulse $\phi W\alpha 2$ as shown in FIG. 7. Clock signal $\phi W\alpha 1$ goes to "H" level in response to the fourteenth toggling step (for reference, the toggling step Nos. of $\overline{CAS}$ signal are shown enclosed by circles in FIG. 7 as well) of $\overline{CAS}$ signal and returns to "L" level in response to the seventeenth toggling step of $\overline{CAS}$ signal. Clock signal $\phi W\beta 1$ goes to "H" level in response to the sixth toggling step of $\overline{CAS}$ signal and returns to "L" level in response to the ninth toggling step of $\overline{CAS}$ signal. Clock signal $\phi W\beta 2$ is produced in synchronization with the low-going level transition of clock signal $\phi W\beta 2$ as shown in FIG. 7.

When $\overline{WE}$ signal is at "L" level, write controller 68 causes this signal to be held by latch circuit 116 in synchronization with the level transition of clock signal $\phi W\alpha 2$, producing output signal WPLS$\alpha$. This signal WPLS$\alpha$ is applied to input data buffer 54 and input shift registers 62a and 62b for activation thereof. Data D1 to D4 entered to terminal Din in serial manner are converted to parallel data by data buffer 54 in synchronization with the first four toggling steps of $\overline{CAS}$ signal. The converted data is transferred, through write gate circuit 58a which is now on, to latch circuit array 60a to be held in latches L1'A, L2'A, L3'A and L4'A. The data is transferred to lines DQA1, DQA2, DQA3 and DQA4 of input/output line set 36a for A memory bank 30a. Since column select line CSLA1 is specified at this point, data D1 to D4 on input/output lines DQA1, DQA2, DQA3 and DQA4 are written into the selected group of memory cells M1, M2, M3 and M4 of A memory bank 30a.

Next, when CSLA1 signal goes to "L" level and CSLB1 signal goes to "H" level, another set of input data D5 to D8 are similarly entered through input buffer 54 and transferred from data buffer 54, through write gate 58b which is now enabled, to the other latch circuit array 60b to be held in latches L1'A, L2'A, L3'A and L4'A in synchronization with the next four toggling steps (i.e., the fifth to eighth toggling steps) of $\overline{CAS}$ signal. The data is transferred to lines DQB1, DQB2, DQB3 and DQB4 of input/output line set 36b for B memory bank 30b. Since column select line CSLB1 is specified at this point, data D5 to D8 on those input/output lines are written into the selected group of memory cells M5, M6, M7 and M8 of B memory bank 30b. During this writing operation input/output lines DQA1, DQA2, DQA3 and DQA4 of A memory bank 30a are precharged.

If $\overline{WE}$ signal is at "L" level when clock signal $\phi W\beta 1$ goes to "H" level in response to the sixth toggling step of $\overline{CAS}$ signal as shown in FIG. 7, the succeeding eight-bit memory access is also considered to be in a data write cycle. Signal $\phi W\beta 1$ goes to "L" level at the time of the low-going level shift at the ninth toggling step of $\overline{CAS}$ signal, producing signal $\phi W\beta 2$. Signal WPLS$\beta$ goes to "H" level, activating input shift registers 62a and 62b again. Therefore, the following input data Dm, Dm+1, Dm+2 and Dm+3 are written into memory cells Mm, Mm+1, Mm+2 and Mm+3 of a memory cell unit associated with a column address select line specified according to column addresses A0c to Anc, in synchronization with the ninth to twelfth toggling steps of $\overline{CAS}$ signal in fundamentally the same manner as described above. During this process input/output lines DQB1, DQB2, DQB3 and DQB4 connected to memory cells M5 to M8 are precharged. Afterward, a memory subgroup having memory cells Mm+4, Mm+5, Mm+6 and Mm+7 of the opposite system memory bank 30a is written into similarly.

As in the data reading operation, memory accessing for data write is also performed in unit of eight bit cells selected from two memory subgroups, each of four memory cells, included in A memory bank 30a and B memory banks 30b. In the midst of accessing the latter four bit cells, that is, at the time of the sixth toggling step of $\overline{CAS}$ signal, preparation for accessing of the next series of eight bit cells is initiated. At this point, when $\overline{WE}$ signal is at "L" level, the next eight bit cells are put in the write mode so that memory accessing for data write is successively performed commencing with one of A memory bank 30a and B memory bank 30b that has already been precharged.

READ/WRITE ALTERNATE EXECUTION MODE

In the midst of accessing of the first eight bit cells, that is, at the time of the sixth toggling step of $\overline{CAS}$ signal, if $\overline{WE}$ signal is at "H" level, then the next eight bit cells are put in the read mode. Hence, memory accessing for data read is performed commencing with a desired memory unit (e.g., subgroup of memory cells Mm, Mm+1, Mm+2 and Mm+3) of one of A memory bank 30a and B memory bank 30b that has already been precharged. This operation mode is the "read/write alternate execution mode."

Figure 8:
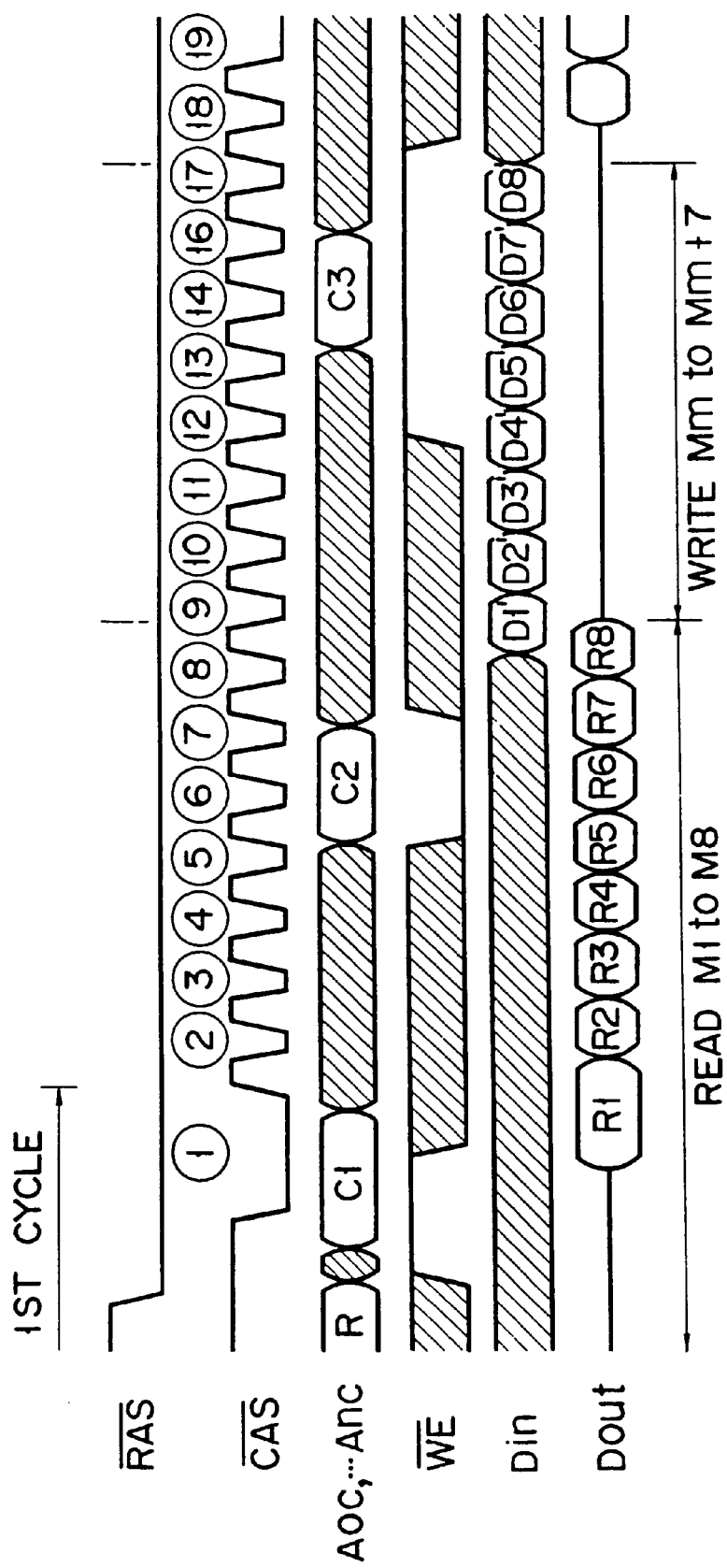
FIG. 8 illustrates waveforms of electrical signals developed at various locations of the DRAM in an operation mode which alternates between data read and data write.

In FIG. 8, there are illustrated waveforms of various signals developed to continue writing input data D1' to D8' into the next eight bit memory cells Mm to Mm+7 in response to $\overline{CSA}$ signal going to "L" level after readout of data from a series of eight bit memory cells M1 to M8. The utility of the DRAM can be increased because of the fact that accessing of memory cells in unit of eight bit cells selected from A memory bank 30a and B memory bank 30b is freely decided between data reading and data writing. Even though such different modes of operation are repeated, any idle time interval will never be produced in switching these modes because necessary preparation or preprocessing (e.g., precharging of a memory bank access to which has been terminated, etc) for executing the next specified mode of operation is made in parallel in the midst of the previous accessing.

According to the DRAM and the specific accessing architecture, each unit of eight bit memory cells halves of which are respectively selected from two memory banks 30a and 30b can be accessed serially and continuously. Since there is no need for any idle time between processes of accessing eight bit cells, the overall operation can be speeded up. The sequence designating constraints on memory accessing in the DRAM can be eliminated to implement random designation. This means that access speed can be improved while leaving merits of the random access. Accordingly, the efficiency of data transfer between the cache memory and the DRAM can be raised. Such features will lend themselves to future DRAMs of higher packing density.

Although the invention has been described with reference to a specific embodiment, it will be understood by those skilled in the art that numerous modifications may be made within the spirit and scope of the invention.

For example, write controller 68 of FIG. 6 may be modified, as shown in FIG. 9, such that clocked inverters 112 and 114 are replaced with OR gates 140 and 142. $\overline{WE}$ signal is applied to inputs of OR gates 140 and 142 via an inverter 142. Internal clock signals $\phi W\alpha 1$ and $\phi W\beta 1$ are applied to the remaining inputs of OR gates 140 and 142. Output signals of OR gates 140 and 142 are applied to latch circuits 116 and 124, respectively. With such an arrangement, effective write control can be implemented.

What is claimed is:

1. A serial-access semiconductor memory device comprising:
    an array of memory cells, subdivided into a plurality of sections, including first and second sections each of which includes a plurality of subsections each having a preselected number of memory cells, said first and second sections constituting first and second memory banks, respectively;
    a first address bus section for said first memory bank, said first address bus section coupled to a first decoder connected to said first memory bank;
    a second address bus section for said second memory bank, said second address bus section coupled to a second decoder connected to said second memory bank;
    a first data transmission line associated with said first memory bank and connected to respective memory cells of each subsection in said first memory bank;
    a second data transmission line associated with said second memory bank and connected to respective memory cells of each subsection in said second memory bank; and
    latch circuits, coupled to said first and second address bus sections, for independently latching address select signals for said each memory banks;
    wherein said first and second data transmission lines are coupled to read data latches for receiving data bits and transferring the data bits to a data out buffer according to an internal clock associated with an input clock.

2. The device according to claim 1, further comprising:
    access controller connected to the first and second address bus sections, for specifying said first and second memory banks in response to a first address signal by randomly selecting one of said subsections in said first memory bank, and for reading data bits which are simultaneously transmitted toward said output section by way of one of the first and second data lines in a parallel manner; and
    said access controller including address data storage circuit for obtaining and storing therein a second address signal specifying a subsection of said second memory bank while said one first memory bark is being accessed.

3. The device according to claim 1, further comprising:
    word lines associated with said array of memory cells, wherein first word lines for the subsections in said first memory bank and second word lines for the subsections in said second memory bank are substantially connected in common.

4. A serial-access semiconductor memory device comprising:
    an array of memory cells, subdivided into a plurality of sections, including first and second sections each of which includes a plurality of subsections each having a preselected number of memory cells, said first and second sections constituting first and second memory banks, respectively;
    a first address bus section for said first memory bank, said first address bus section coupled to a first decoder connected to said first memory bank;
    a second address bus section for said second memory bank, said second address bus section coupled to a second decoder connected to said second memory bank;
    a first data transmission line associated with said first memory bank and connected to respective memory cells of each subsection in said first memory bank;
    a second data transmission line associated with said second memory bank and connected to respective memory cells of each subsection in said second memory bank; and
    latch circuits, coupled to said first and second address bus sections, for independently latching address select signals for said each memory banks;
    wherein said first and second data transmission lines are coupled to read data latches for receiving data bits and transferring the data bits to a data out buffer according to an internal clock associated with an input clock; and
    wherein said latch circuits include first and second latch circuits which are associated with said first and second address bus sections respectively.

5. The device according to claim 4, wherein each of said first and second address storage circuits includes a latch circuit.

6. The device according to claim 2, wherein said address storage circuit obtains and stores therein an address signal specifying a next subsection of said first memory bank while a corresponding subsection is being accessed in said second memory bank.

7. The device according to claim 2, further comprising circuit for performing an alternate data transmission using said first data line and said second data line when said first and second data bits are sent from said first and second memory banks toward said read data latches.

8. The device according to claim 2, wherein said access controller further includes:
    a set of switching transistors connected between said first data line and said read data latches, said transistors having gate electrodes coupled to a control signal.

9. The device according to claim 2, further including:
    a first set of switching transistors connected between said first data lines and said read data latches, said transistors having gate electrodes coupled to a first control signal; and
    a second set of switching transistors connected between said second data lines and said read data latches, said second set of transistors having gate electrodes coupled to a second control signal.

10. The device according to claim 9, further including:
    array of latch circuits having inputs connected to the first and second sets of transistors and an output connected to said read data latches.

11. The device according to claim 10, wherein said latch circuits are equivalent in number to a number of each of said first and second sets of transistors.

12. A serial-access semiconductor memory device comprising:

an array of memory cells being subdivided into a plurality of sections including first and second sections each of which includes a plurality of subsections each having a preselected number, at least one, of memory cells, said first and second sections constituting first and second memory banks, respectively;

word lines associated with said array of memory cells, wherein first word lines for the subsections in said first memory bank and second word lines for the subsections in said second memory bank are substantially selected in common;

a first address bus section for said first memory bank;

a second address bus section for said second memory bank;

a first parallel data transmission line associated with said first memory bank and connected to respective memory cells of each subsection in said first memory bank;

a second parallel data transmission line associated with said second memory bank and connected to respective memory cells of each subsection in said second memory bank;

an output section connected to the first and second data lines and having an output; and access controller coupled to the first and second address bus sections and said output section, for specifying said first and second memory banks, for randomly selecting one of said subsections in said first memory bank and a corresponding one of said subsections in said second memory bank in response to an address signal, and for serially accessing memory cells of said first and second memory banks, first data bits of said first memory bank being transmitted in parallel toward said output section and second data bits of said second memory bank being transmitted in parallel toward said output section;

said output section including register for receiving the first data bits and the second data bits and for selecting these first and second data bits to form a series of data bits which will then be sent forth to said output;

said access controller including address data storage circuit for storing therein an address signal specifying said corresponding subsection of said second memory bank while said one of said subsections is accessed in said first memory bank; and said address data storage circuit including first and second address storage circuits which are associated with said first and second address bus sections, respectively.

13. The device according to claim 12, wherein each of said first and second address storage circuits includes a latch circuit.

14. The device according to claim 12, wherein said first data line and said second data line perform alternate data transmission when said first and second data bits are sent from said first and second memory banks toward said register.

15. The device according to claim 12, further including:

a first set of switching transistors connected between said first data line and said register, said first set of transistors having gate electrodes coupled to a first control signal; and a second set of switching transistors connected between said second data line and said register, said second set of transistors having gate electrodes coupled to a second control signal.

16. The device according to claim 15, wherein said access controller further includes:

an array of latch circuits having inputs connected to the first and second sets of transistors and an output connected to said register.

17. The device according to claim 16, wherein said latch circuits are equivalent in number to a number of each of said first and second sets of transistors.

18. A serial-access semiconductor memory device comprising:

an array of memory cells, subdivided into a plurality of sections, including first and second sections each of which includes a plurality of subsections each having a preselected number of memory cells, said first and second sections constituting first and second memory banks, respectively;

a first address bus section for said first memory bank, said first address bus section coupled to a first decoder connected to said first memory bank and a first address storage register which is associated with said first address bus section;

a second address bus section for said second memory bank, said second address bus section coupled to a second decoder connected to said second memory bank and a second address storage register which is associated with said second address bus section;

a first data transmission line associated with said first memory bank and connected to respective memory cells of each subsection in said first memory bank;

a second data transmission line associated with said second memory bank and connected to respective memory cells of each subsection in said second memory bank; and said first and second data transmission lines being coupled to read data latches for receiving data bits and transferring the data bits to a data out buffer according to an internal clock associated with an input clock.

19. A serial-access semiconductor memory device comprising:

an array of memory cells, subdivided into a plurality of sections, including a pair of first and second sections each of which includes a plurality of subsections each having a preselected number of memory cells, said first and second sections constituting first and second memory banks, respectively;

a first address bus section for said first memory bank;

a second address bus section for said second memory bank;

first parallel data transmission lines associated with said first memory bank and connected to respective memory cells of each subsection in said first memory bank;

second parallel data transmission lines associated with said second memory bank and connected to respective memory cells of each subsection in said second memory bank;

an output section connected to the first and second parallel data transmission lines and having an output, said output section including register for receiving first parallel data bits and second parallel data bits and for allowing these first and second parallel data bits to be converted into a series of data bits which will then be sent to said output, and access controller, connected to the first and second address bus sections, for specifying said first and second memory banks in response to a first address signal, said access controller including first and second address data storage circuits for obtaining and storing therein respective first and second address signals, said second address signal specifying a subsection of said second memory bank while said first memory bank is being accessed, said first address signal specifying a subsection of said first memory bank while said second memory bank is being accessed.

20. The device according to claim 19, further comprising:

word lines associated with said array of memory cells, wherein first word lines for the subsections in said first memory bank and second word lines for the subsections in said second memory bank are substantially connected in common.

21. The device according to claim 19, wherein said address data storage circuit includes first and second address storage circuits which are associated with said first and second address bus sections, respectively.

22. The device according to claim 21, wherein each of said first and second address storage circuits includes a latch circuit.

23. The device according to claim 19, further comprising a circuit for performing an alternate data transmission using said first parallel data transmission lines and said second parallel data transmission lines when said first and second data bits are sent from said first and second memory banks toward said register.

24. The device according to claim 19, further including:

a set of switching transistors connected between said first parallel data transmission lines and said register, said transistors having gate electrodes coupled to a control signal.

25. The device according to claim 19, further including:

a first set of switching transistors connected between said first parallel data transmission lines and said register, said first set of transistors having gate electrodes coupled to a first control signal; and a second set of switching transistors connected between said second parallel data transmission lines and said register, said second set of transistors having gate electrodes coupled to a second control signal.

26. The device according to claim 25, wherein said access controller further includes:

an array of latch circuits having inputs connected to the first and second sets of transistors and an output connected to said register.

27. The device according to claim 26, wherein said latch circuits are equivalent in number to a number of each of said first and second sets of transistors.

28. A semiconductor memory device comprising:

an array of memory cells subdivided into at least first and second memory banks;

bit lines and word lines electrically coupled to said memory cells, respectively;

an address bus section for said first and second memory banks;

first data transmission lines independently provided for each of said memory banks;

address select lines for selecting said memory cells to transfer data to said first data transmission lines; and address select signal latch circuits coupled to said address bus section, and respectively provided for each of said first and second memory banks.

29. A device according to claim 28, further comprising:

read data latches, coupled to said first data transmission lines for receiving data bits transmitted from said first and second memory banks.

30. A device according to claim 29, further comprising:

second data transmission lines;

a bus select circuit for connecting said first data transmission lines to said second data transmission lines; and a data output buffer connected to said second data transmission lines.

31. A device according to claim 30, further comprising:

circuits for receiving a next address, while said latch circuits latch address select signals.

32. The device according to claim 30, wherein:

said read data latches are connected between said bus select circuit and said data output buffer.

33. The device according to claim 30, wherein said word lines for each of said memory banks are independent.

34. The device according to claim 33, wherein data included in two adjacent subsections are read out serially.

35. The device according to claim 33, wherein data included in two adjacent subsections are read out simultaneously to said read data latches, and said data are serially read out from said read data latches according to an internal clock associated with an input clock.

36. A device according to claim 28, further comprising:

circuits for receiving a next address, while said latch circuits latch address select signals.

37. A device according to claim 28, wherein said word lines for each memory bank are independent.

38. A semiconductor memory device comprising:

an array of memory cells subdivided into at least first and second memory banks each of which includes a plurality of subsections;

bit lines and word lines electrically coupled to said memory cells;

an address bus section for said first and second memory banks;

first data transmission lines for connecting respective memory cells of each subsection in said memory banks, said first data transmission lines being provided for each of said memory banks independently;

address select lines for selecting said memory cells to transfer data to said first data transmission lines; and latch circuits, coupled to said address bus section and said address select lines, for latching address select signals to receive a next column address without changing a column being accessed, said latch circuits being respectively provided for said first and second memory banks.

39. The device according to claim 38, wherein data included in two adjacent subsections are read out serially.

40. The device according to claim 38, wherein data included in two adjacent subsections are read out simultaneously to said read data latches, and said data are serially read out from said read data latches according to an internal clock associated with an input clock.

41. The device according to claim 38, further comprising:

a bus select circuit for connecting said first data transmission lines which are coupled to a data output buffer; and read data latches for receiving data bit transmitted toward said data output buffer, said first data transmission lines being connected to said read data latches via said bus select circuit.

42. A semiconductor memory device comprising:

an array of memory cells subdivided into at least first and second memory banks each of which includes a plurality of subsections;

bit lines and word lines electrically coupled to said memory cells;

an address bus section for said first and second memory banks;

first data transmission lines for connecting respective memory cells of each subsection in said memory banks;

address select lines for selecting said memory cells to transfer data to said first data transmission lines;

latch circuits coupled to said address bus section and said address select lines for latching address select signals, said latch circuits provided for each bank respectively;

a bus select circuit for connecting said first data transmission lines to second data transmission lines which are coupled to a data input buffer; and data input latches coupled to said second data transmission lines for receiving data bits from the data input buffer, said data input latches receiving input data from the data input buffer according to an internal clock associated with an input clock.

43. A semiconductor memory device comprising:

an array of memory cells subdivided into at least first and second memory banks each of which includes a plurality of subsections;

bit lines and word lines electrically coupled to said memory cells;

an address bus section for said first and second memory banks;

first data transmission lines for connecting respective memory cells of each subsection in said memory banks, said first data transmission lines provided for each of said memory banks respectively;

address select lines for selecting said memory cells to transfer data to said first data transmission lines;

latch circuits, coupled to said address bus section and said address select lines, for latching address select signals;

a bus select circuit for connecting said first data transmission lines to second data transmission lines which are coupled to data output buffer; and read data latches for receiving data bits transmitted from said first and second memory banks, said read data latches holding read data from said first memory bank while receiving an address for said second memory bank into said latch circuits.

44. The device according to claim 43, wherein data included in adjacent subsections are read out serially.

45. The device according to claim 43, wherein data included in two adjacent subsections are read out simultaneously to said read data latches according to an internal clock associated with an input clock.

46. A computer system comprising:

high speed cache memory; and a main memory connected to said cache memory via a control circuit, said main memory composed of a memory device comprising:

an array of memory cells subdivided into at least first and second memory banks;

bit lines and word lines electrically coupled to said memory cells;

an address bus section for said first and second memory banks;

first data transmission lines respectively provided for each of said first and second memory banks;

address select lines for selecting said memory cells to transfer data to said first data transmission lines; and address select signal latch circuits coupled to said address bus section and said address select lines, and respectively provided for each of said first and second memory banks.

47. A computer system comprising:

high speed cache memory; and a main memory connected to said cache memory via a control circuit, said main memory composed of a memory device comprising:

an array of memory cells subdivided into at least first and second memory banks each of which includes a plurality of subsections;

bit lines and word lines electrically coupled to said memory cells;

an address bus section for said first and second memory banks;

first data transmission lines for connecting respective memory cells of each subsection in said memory banks, said first data transmission lines being provided for each of said memory banks respectively;

address select lines for selecting said memory cells to transfer data to said first data transmission lines;

latch circuits, coupled to said address bus section and said address select lines, for latching address select signals, said latch circuits being respectively provided for said first and second memory banks.

48. A computer system comprising:

high speed cache memory; and a main memory connected to said cache memory via a control circuit, said main memory composed of a memory device comprising:

an address bus section for first and second memory banks;

first data transmission lines for connecting respective memory cells of each subsection in said memory banks, said first data transmission lines being provided for each of said memory banks respectively;

address select lines for selecting said memory cells to transfer data to said first data transmission lines;

latch circuits, coupled to said address bus section and said address select lines, for latching address select signals;

a bus select circuit for connecting said first data transmission lines to second data transmission lines which are coupled to data output buffer; and read data latches for receiving data bits transmitted from said first and second memory banks, said read data latches holding read data from said first memory bank while receiving an address for said second memory bank into said latch circuits.

* * * * *

UNITED STATES PATENT AND TRADEMARK OFFICE
CERTIFICATE OF CORRECTION

PATENT NO. : 6,404,696 B1 Page 1 of 1
DATED : June 11, 2002
INVENTOR(S) : Oowaki It is certified that error appears in the above-identified patent and that said Letters Patent is hereby corrected as shown below:

Title page,
Item [63], Related U.S. Application Data, should read:
-- [63] Continuation of application No. 09/603,895, filed on Jun. 26, 2000, now U.S. Pat. No. 6,301,185, which is a continuation of application No. 08/578,900, filed Dec. 27, 1995, now Pat. No. 6,118,721, and a continuation of application No. 08/330,120, filed on Oct. 27, 1994, now Pat. No. 5,497, 351, which is a continuation of application No 08/120,221, filed on Sep. 14, 1993, now abandoned, which is a continuation of application No. 07/956,469 filed on Oct. 2, 1992, now abandoned, which is a continuation of application No. 07/704,733, filed on May 20, 1991, now abandoned, which is a continuation of application No. 07/388,157, filed On Apr. 14, 1989, now abandoned. --

Signed and Sealed this

First Day of June, 2004

JON W. DUDAS
*Acting Director of the United States Patent and Trademark Office*